United States Patent [19]

Mello

[11] Patent Number: 4,728,246

[45] Date of Patent: Mar. 1, 1988

[54] WAFER BOAT TRANSFER TOOL

[75] Inventor: William R. Mello, Huntington Beach, Calif.

[73] Assignee: Thermco Systems, Inc., Orange, Calif.

[21] Appl. No.: 863,963

[22] Filed: May 16, 1986

[51] Int. Cl.⁴ .............................................. B65G 1/10
[52] U.S. Cl. ..................................... 414/592; 118/500; 206/334; 211/41; 432/258; 432/259
[58] Field of Search ............... 414/592, 607, 608, 785, 414/618, 182, 331; 432/11, 123, 208, 239, 258, 259; 206/334, 454, 445, 503, 511, 444; 118/728, 729, 500, 503; 211/41; 269/296, 903

[56] References Cited

U.S. PATENT DOCUMENTS

| | | | |
|---|---|---|---|
| 2,468,326 | 4/1949 | Gleason | 414/592 X |
| 3,187,917 | 6/1965 | Miller | 414/592 X |
| 3,998,333 | 12/1976 | Kamada | 432/258 X |
| 4,093,201 | 6/1978 | Dietze et al. | 118/728 X |
| 4,378,189 | 3/1983 | Takeshita | 414/331 X |
| 4,466,381 | 8/1984 | Jenkins | 118/500 X |
| 4,543,059 | 9/1985 | Whang et al. | 414/331 X |
| 4,572,101 | 2/1986 | Lee | 118/500 |

Primary Examiner—Dave W. Arola
Attorney, Agent, or Firm—John K. Williamson; James C. Valentine

[57] ABSTRACT

A wafer boat transfer tool has an upper fork and a lower fork which may be differently configured for supporting wafer boats in different ways. The same tool may be used to transfer boats in one or more steps from locations where they are supported in one way to other locations where they are supported in the same or a different way. Also, the tool may be used to transfer more than one boat at a time without excessive travel in a direction parallel to the boat loader axis.

A versatile wafer designed for use with two different forks of the tool may be utilized with different boat loaders and a common wafer transfer machine and in-process storage nests.

10 Claims, 8 Drawing Figures

WAFER BOAT TRANSFER TOOL

This invention relates to a tool for transferring semiconductor wafer boats and a boat for use therewith.

In the manufacture of semiconductors, wafers must be processed in controlled atmosphere (or "clean") rooms to reduce the contamination of wafers by airborne particulates to the lowest practical levels. In addition, the processing and transfer steps are automated to, inter alia, reduce the amount of particulates generated in the rooms by the operating people. In particular, the transfer and treatment of wafers in batch type diffusion processes have been highly automated. Typically, a horizontal diffusion furnace comprises a vertical stack of two to four tubes in a cabinet with a wafer transfer machine located nearby. The wafer transfer machine transfers the wafers from plastic carriers (which cannot stand up to the processing conditions in the diffusion tubes) to quartz boats which can stand up to processing conditions (such as those sold by Quartz Engineering & Materials, Inc., Micro Glass, Inc. and others). A cartesian coordinate elevator ("robot") with a tool ("end effector") for picking up the boats then transfers the boats between the wafer transfer machine and in-process storage on one hand and moveable cantilevered boat loaders associated with the diffusion tubes on the other. The cantilevered boat loaders in turn transfer the boats into and out of the tube.

Because of the tremendous expense associated with clean rooms and automated equipment utilized in manufacturing semiconductors, the rooms and equipment must be as compact as possible and the various operations must be as fast, as versatile and as efficient as possible. Thus, the tubes in the vertical stack may be dedicated to different processes which frequently involves specially designed boat loaders associated with the processes. This in turn requires differently configured boats which require differently configured tools for transferring wafer ladened boats between the wafer transfer machine and the boat loaders.

The wafer boat transfer tool of the present invention may be used to transfer boats to different boat loaders. This tool may also be used to carry more boats than do conventional tools to the same boat loaders without requiring as many trips to and from the diffusion tube. Most broadly considered, the improved tool employs an upper fork means adapted to support a boat and a lower fork means adapted to support a boat to achieve these objects. Each fork means may be configured for transferring wafer boats to and from different tubes or, alternatively, each fork means may be configured for transferring wafer boats to and from the same tube. The wafer boat of the present invention may be supported by more than one type of fork.

Other details, objects and advantages of the invention will become apparent as the following description of certain present preferred embodiments thereof proceeds.

In the accompanying drawings, certain preferred embodiments of the invention are shown in which:

FIG. 1 schematically shows a horizontal furnace comprising a vertical stack of four reactor tubes and their associated boat loaders, with which the improved wafer boat transfer tool may be used;

Figure 1:
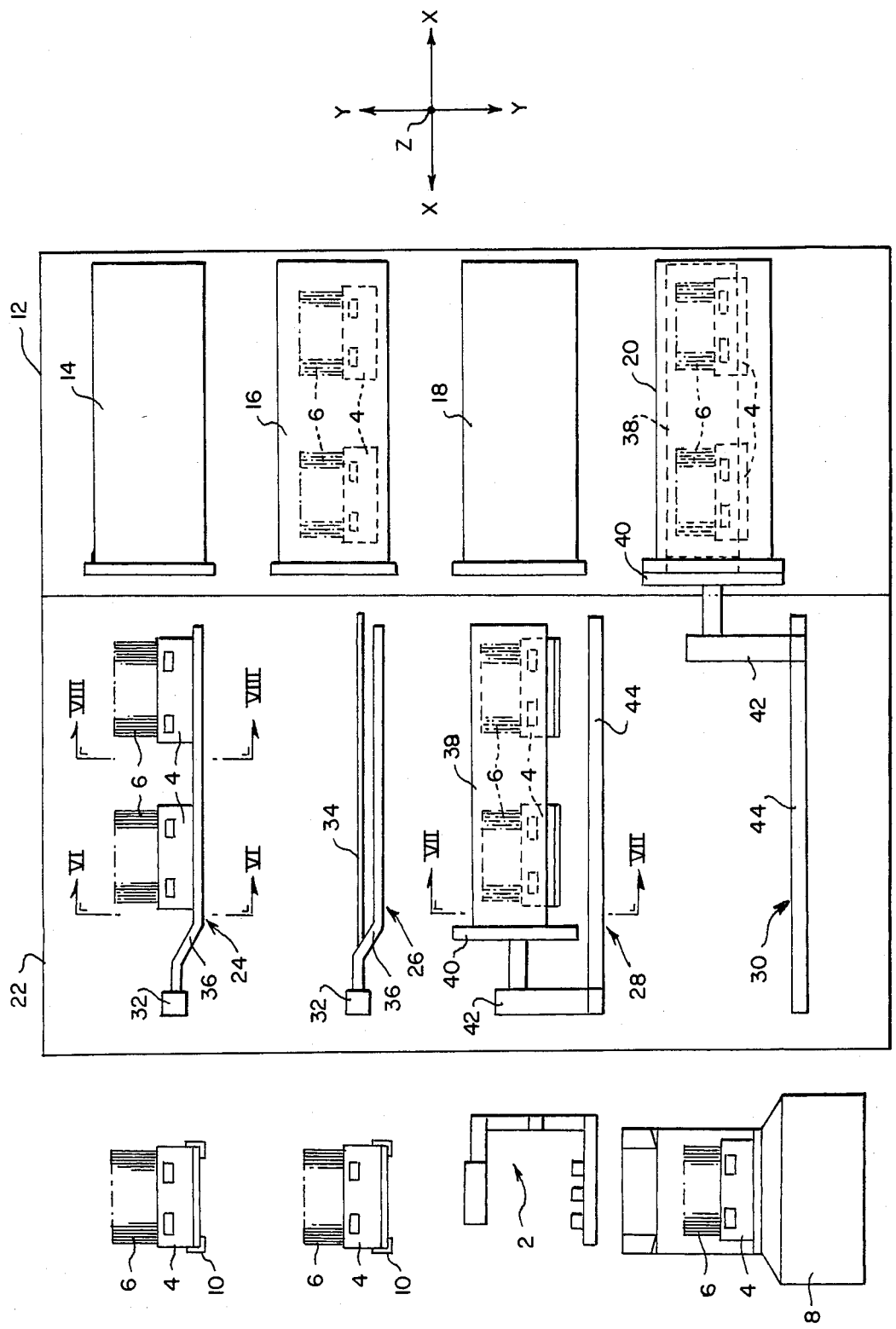

FIG. 1 generally shows the improved transfer tool 2 which is intended for use in connection with the transfer of boats 4 carrying spaced apart wafers 6 between a transfer machine 8 and in-process storage means such as support arms 10 and between either of them and a diffusion furnace 12. FIG. 1 illustrates a conventional horizontal furnace 12 having four quartz tubes 14, 16, 18 and 20 and an adjacent loading station 22 having four cantilevered boat loading mechanisms 24, 26, 28 and 30 axially aligned with the tubes. Following conventional terminology, FIG. 1 and the other drawings generally refer to the axial direction of the tubes as the "X" direction, the vertical as the "Y" direction and the third orthogonal direction as the "Z" direction.

The transfer tool 2 carries wafer boats 4 to and from the cantilevered boat-loading mechanisms 24, 26, 28 and 30 which in turn transfer the wafer-ladened boats into and out of the tubes 14, 16, 18 and 20 respectively. Mechanisms 24 and 26 illustrate a so-called paddle device (such as are sold by the Norton Company and others) comprising a driven support 32 which is connected by a shaft (not shown) extending through an elongated slot 34 in the rear wall of the loading station to a drive means (also not shown). Also, these mechanisms may be controlled by a soft landing support (not shown). Paddles 36 having flattened portions for supporting the boats 4 cantilever from the supports 32 as may be better seen in FIG. 6. Mechanisms 28 and 30 illustrate another loading device having an open ended tubular member 38 for protecting hot wafers contained therein from the air until they have cooled to sufficiently low temperatures. Generally speaking, the tubes 38 cantilever from a flange 40 mounted to a support 42 which travels on way 44. Mechanisms 28 and 30, which are sold under the name "Atmoscan", are described in detail in U.S. Pat. No. 4,543,059, which is incorporated by reference. Mechanisms 24 and 28 illustrate their locations when the boats 4 are transferred between the improved tool 2 and the cantilevered loading mechanisms. Mechanisms 26 and 30 are shown in the locations they occupy when the wafers 6 are being processed.

In some processes, the wafers 6 are processed while on the paddles 26 and, therefore, the paddle mechanism 26 is not withdrawn from the tube as shown. In these processes, the load end of the diffusion tube may be covered with a scavenger device.

Figure 3:
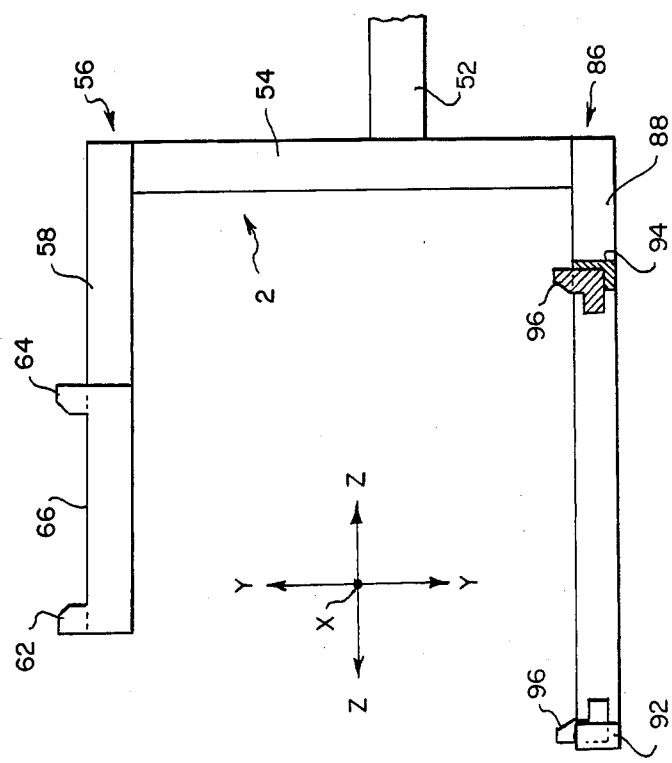
FIG. 3 is a partial sectional view of the improved tool of FIG. 2 as taken along sectional line 3—3.
Figure 2:
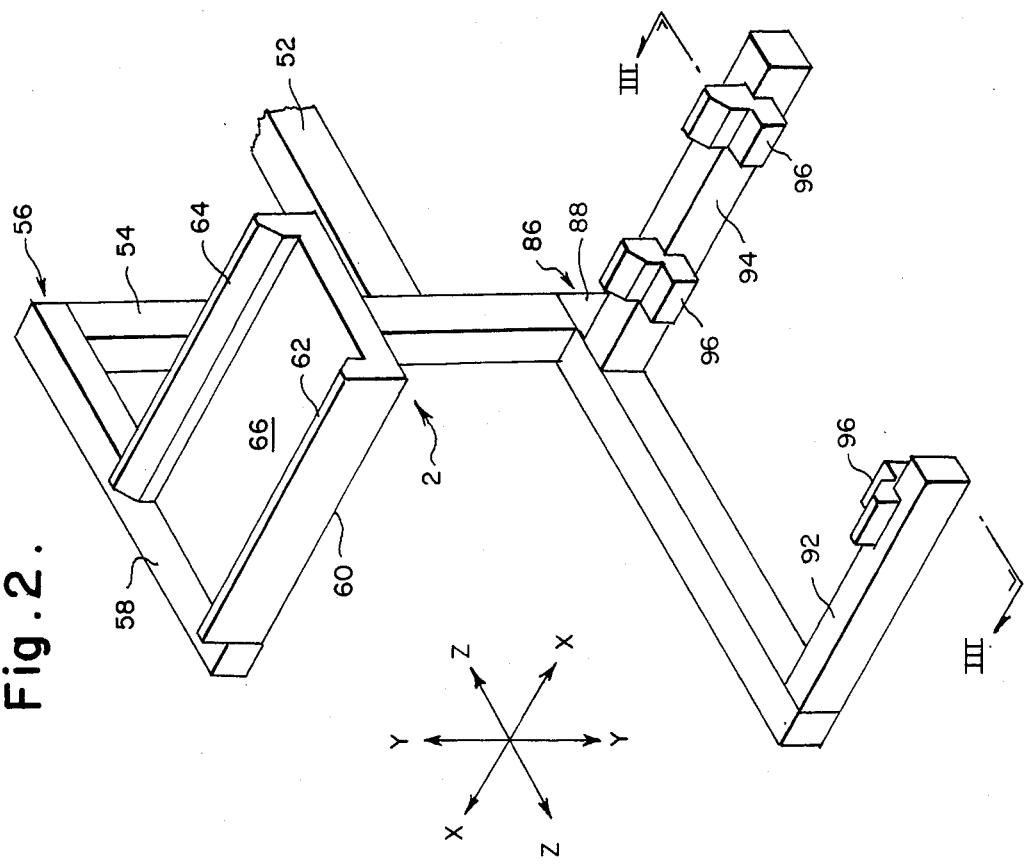
FIG. 2 is a front perspective view of one embodiment of the improved tool.
Figure 7:
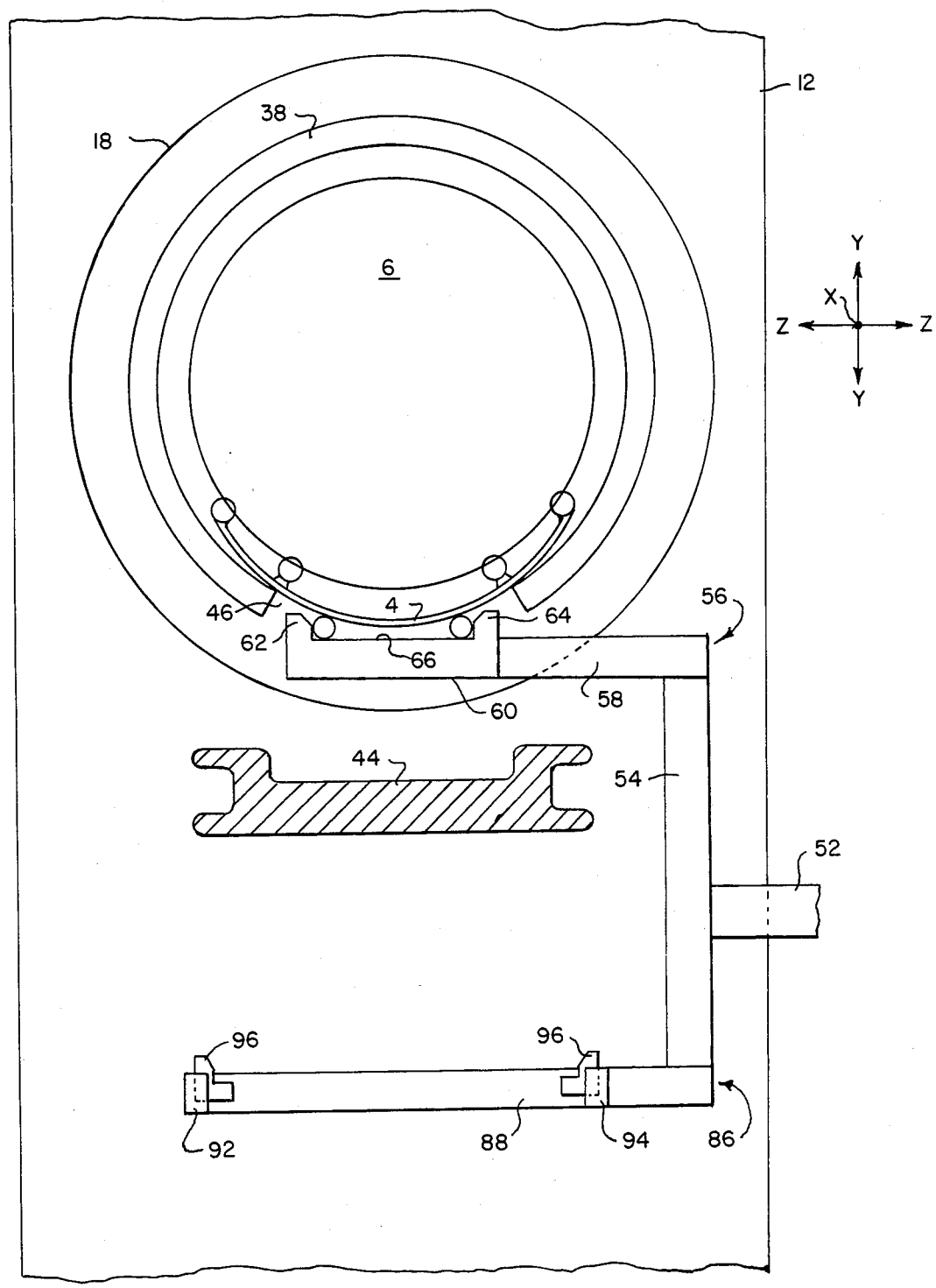
FIG. 7 is a view generally taken along section line 7—7 on FIG. 1 showing the upper fork means of an improved tool transferring a boat into a tubular member.

The improved wafer boat transfer tool 2 shown in FIG. 1 is shown in greater detail in FIGS. 2 and 3. The tool 2 has a shank 52 extending from a three axis robot (not shown) in the Z direction to a vertical member 54 which supports an upper fork means 58 and a lower fork means 86. The upper fork means 56 has a stem 58 extending in the Z direction from the upper end of the vertical member 54 and an X directed member 60 projecting from the unsupported end of stem 58 with upwardly directed tines 62 and 64 separated by a land 66. The upper fork means 56 of FIG. 2 is adapted to support the bottom of boats 4 in one of two ways. Preferably, legs or rails 74 extending from the bottom of a boat 4 are supported on a land 66 (as is shown in FIG. 7) or (less desirably) the tines 62 and 64 directly support the shell 70 of the boat (in which case the land 66 is unnecessary). It is preferable in all cases to support the rails rather than the shell directly.

Figure 8:
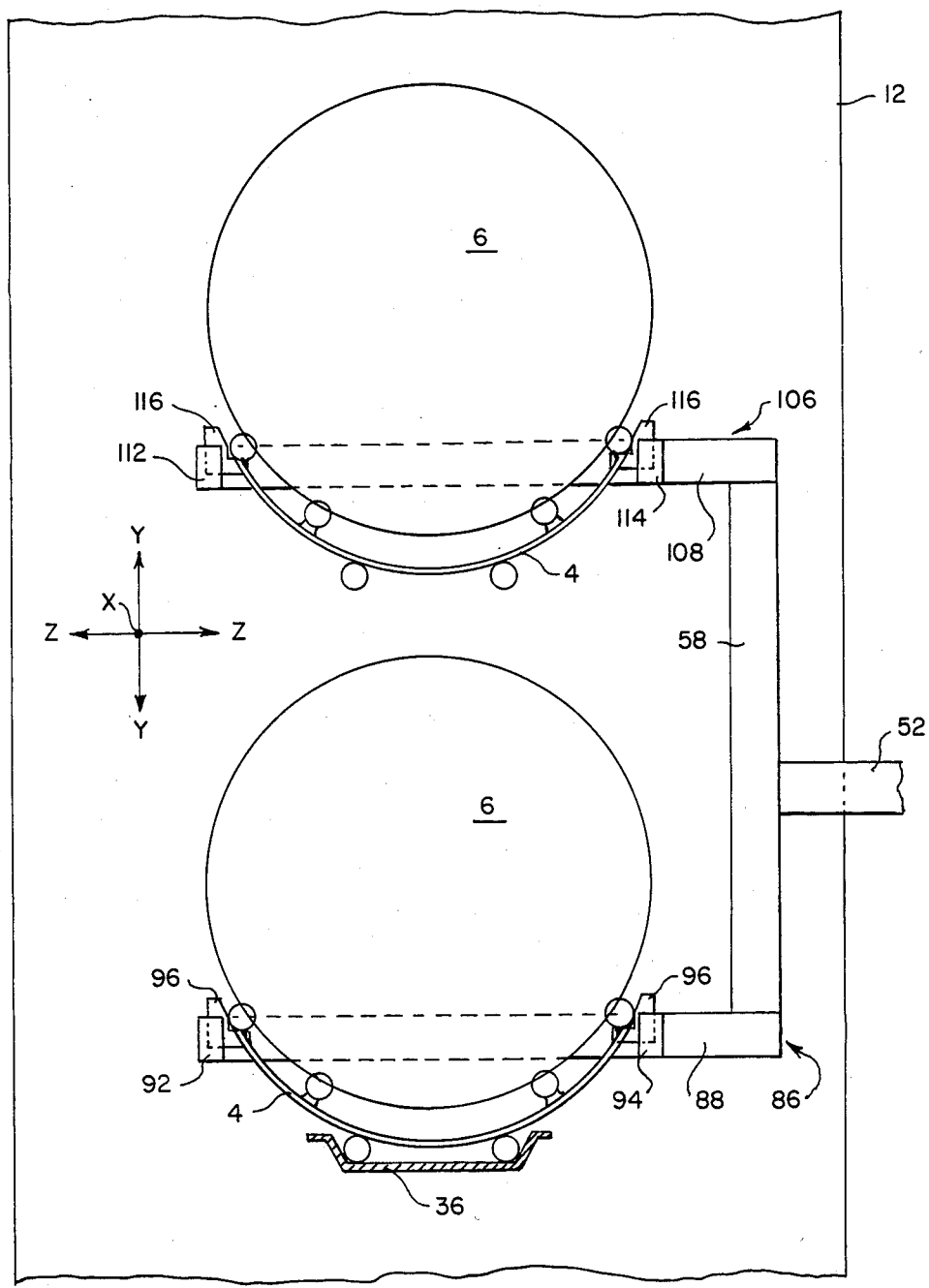
FIG. 8 is a view generally taken along section line 8—8 on FIG. 1 showing an improved tool transferring two boats to a paddle.

The lower fork means 86 has a stem 88 extending in the Z direction from the bottom end of the vertical member 54 and X directed tines 92 and 94 projecting from the sides of stem 88. The tines 92 and 94 have ceramic (or other suitable material) inserts 96 for supporting the sides of boats 4 by the top rails 72 (as is shown in FIG. 8). The inserts 96 may have tapers which centralize the boats during the pickup operation.

Figure 4:
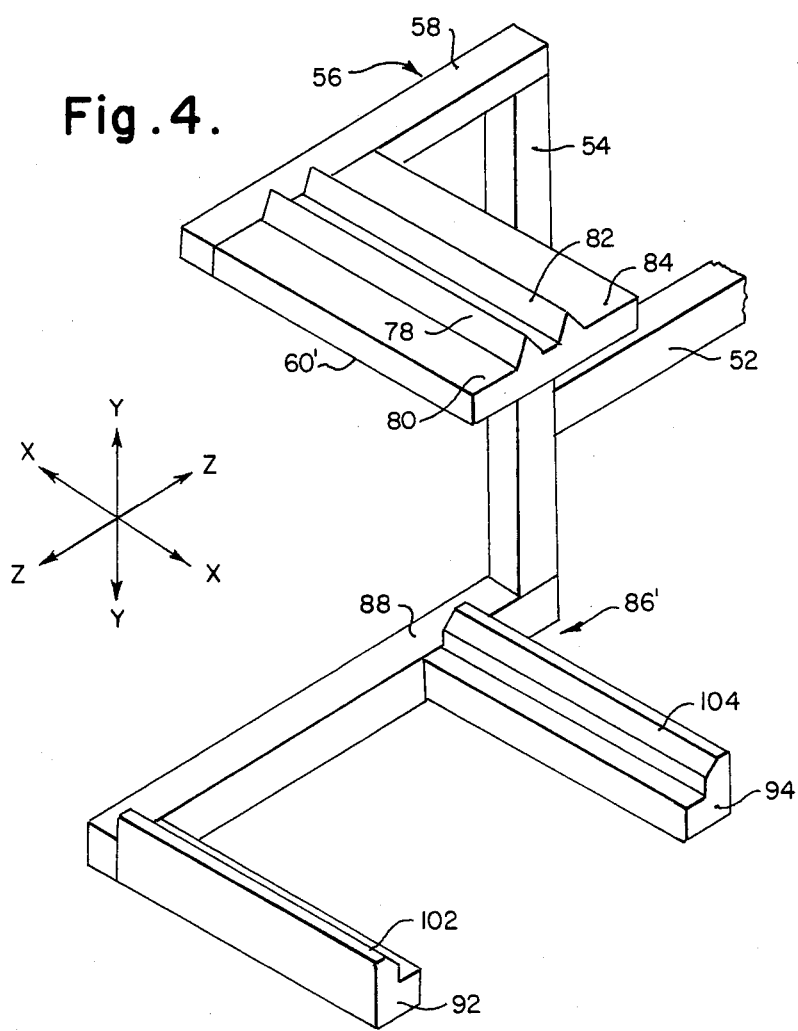
FIG. 4 is a front perspective view of a second embodiment of the improved tool.

FIG. 4 shows another embodiment of a transfer tool 2' in which the upper fork means 60' has tines 78 and 82 disposed between two lands 80 and 84. Preferably legs or rails 74 on the bottom of the boats 4 may be supported on the lands 70 and 74. However, the tines 78 and 82 may be used to directly support the shell of the boats 4. The lower fork means 86' has a pair of tines 92 and 94 projecting from the stem 88 with upward projections 102 and 104 extending upwardly which may be used to engage the shell of the boats 4 although it would be preferable to engage the top rail of the boats 4.

Figure 5:
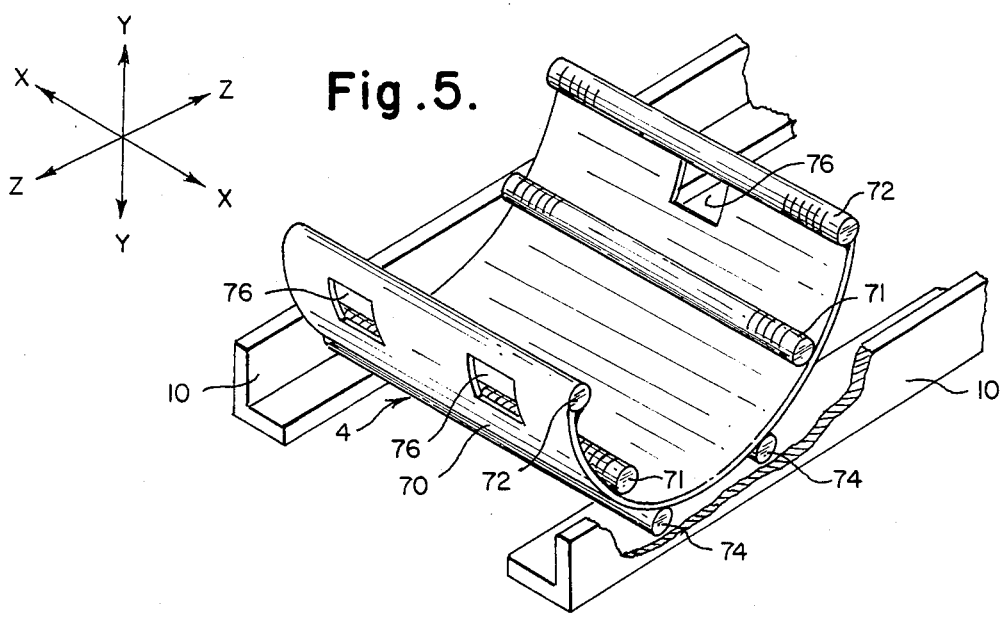
FIG. 5 is a perspective view of a wafer boat designed for use with the embodiment of the invention shown in FIG. 2.

FIG. 5 illustrates a boat 4 designed for use with either fork means of FIG. 2. The boat generally comprises a semicircular quartz shell 70 having two lower and two top longitudinally disposed internal rails 71 and 72 respectively along the inner surface of the shell 70 and two longitudinally disposed legs or rails 74 along the outer surface of the bed 70. The boat 4 as illustrated may hold up to about fifty 100 or 150 mm silicon wafers maintained in spaced apart vertical relationship by means of slots in the inner rods 71 and 72 (which are not shown). Obviously, the boats 4 may be designed to hold one hundred or more wafers 6 of diameters of up to 200 mm or larger. The sides of shell 70 have slots 76 which are designed to accept inserts 96 of tines 92 and 94 for supportingly engaging the upper rails 72 of the boat 4. During processing in a covered boat loader, the shell 70 of the wafer boat and the tubular member 38 form a continuous peripheral surface around the wafers 6. Thus, the inner rails 71 and 72 do not interfere with the tubular member 38 and the outer rails 70 merely depend from the shell between the extremities of the tube 38. The boat 4 also permits continuous wafer spacing across several boats because it does not have the normal structural parts at its ends for receiving the supporting transfer tools.

Figure 6:
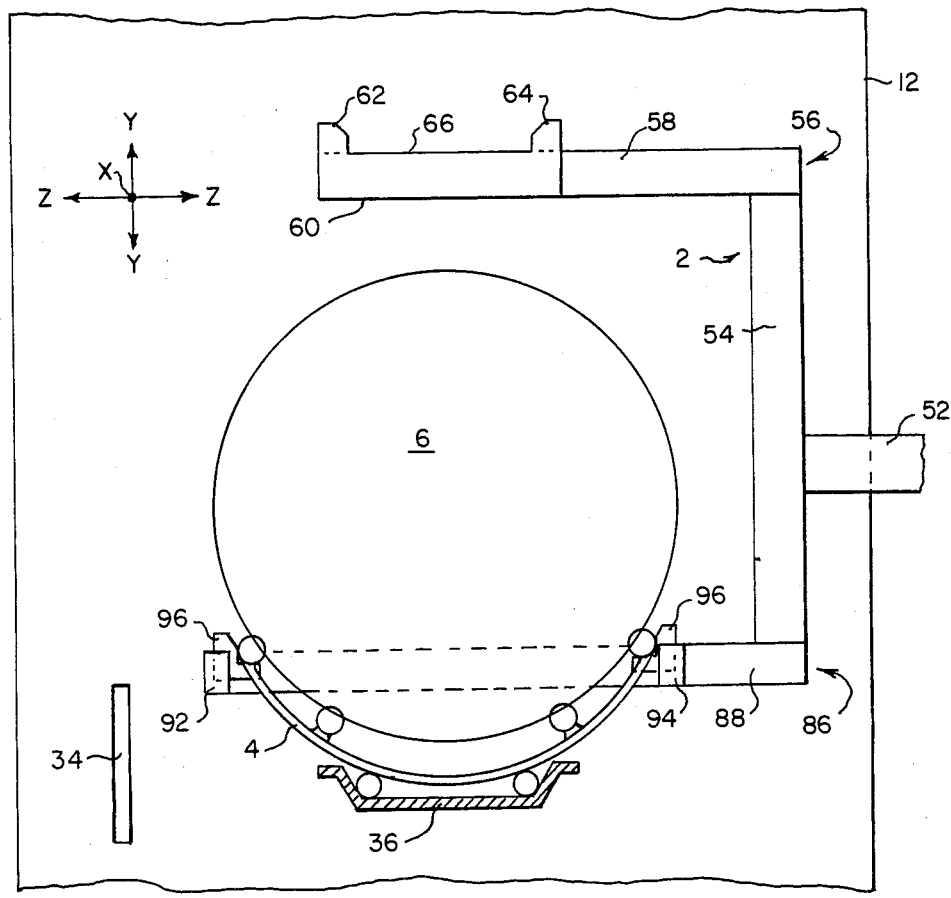
FIG. 6 is a view generally taken along section line 6—6 on FIG. 1 showing the lower fork means of an improved tool transferring a boat to a paddle.

If the boat 4 on the support arms 10 as shown in FIG. 5 (or on a transfer machine 8) were to be transferred to a paddle 36, it would be necessary to support the boat 4 along its top rails 72 during the transfer step because the rails 74 of the boats 4 rest directly on the paddles. The transfer tool 2 would approach the upper end of the boat along the Z axis and then along the X axis until the inserts 96 were aligned with (but below) the slots 76 of the boats 4. The tool 2 would then move upwardly along the Y axis to pick up and raise the boat 4 until it had cleared the arms 10. The tool 2 would withdraw along the Z axis to a position beyond any interfering projections along the X axis and it would translate along the X axis to a position in front of a paddle 36, adjust vertically along the Y axis to a position above the paddle and then advance in the Z direction to a point over the paddle 36 and descend to a position where the inserts 96 clear the sides of the boat 4. FIG. 6 illustrates the tool 2 in such a position. The tool 2 would then be withdrawn along the X axis toward the furnace 12 and the Z axis to permit the loading mechanism to advance toward the furnace 12. The tool 2 would retrieve the boat 4 from the paddle 36 by a reverse sequence.

If a boat were to be transferred into the tubular member 38, it would be necessary to support the boat 4 along its bottom rails 74 (as is shown in FIG. 7) because the shell 70 of the boat 4 rests directly on the tubular member 38. Therefore, it would be normally necessary to first transfer a boat 4 from a wafer transfer device such as machine 8 (shown in FIG. 1) to an intermediate in-process storage position such as arms 10 (shown in FIGS. 1 and 5) because boats 4 are normally supported at their bottom surfaces during transfers on such wafer transfer devices. The boat 4 on arms 10 would be picked-up on upper fork means 56 from below and raised to a position which cleared the arms and then withdrawn along the Z axis to a position beyond any interfering projections. The tool 2 would then translate along the X axis to a position between the unsupported end of the tubular member 38 and the furnace 12 and then advance along the Z axis to a position in alignment with the axis of the tube 38. The tool would then adjust along the Y axis if necessary to center the boat 4 in front of the tube 38 and advance through the slot 46 with the wafer ladened boat 4 supported thereon in the center of the tube to a predetermined location. Finally, the tool 2 would descend along the Y axis to a position whereby the sides of the boat 4 would directly rest upon the inner surfaces of tubular member 38 for support and the boat would effectively seal a portion of the opening of the slot 46. The tool 2 would then retreat along the Z axis so that the cantilevered tubular member 38 may be loaded into the furnace 12. The tool 2 would then retrieve the boat 4 from the tubular member 36 by a reverse sequence.

Another embodiment of the present invention is shown in FIG. 8. This embodiment has an upper fork means designed to support a boat 4 in the same or similar manner as does the lower fork means. FIG. 8 shows a transfer tool 2'' having a lower fork means 86 which is identical to the lower fork means shown in FIG. 2. The tool 2'' also has an upper fork means 106 which is identical to the lower fork means 86. Thus, a stem 108 extends in the Z direction from the vertical member 58 and tines 112 and 114 having inserts 116 extend from stem 108 in the X direction. This fork allows the two boats 4, 4 on support arms 10 in FIG. 1 to be simultaneously picked up and transferred to a position aligned with a paddle 36 onto which the boats 4 may be loaded serially. Alternatively, it would also be possible to load two paddles 36 simultaneously. The tool 2'' shown in FIG. 8 is particularly useful because it requires less displacement in the X direction during loading or unloading than would tools which support boats in axially spaced apart relation with same plane. In addition, it requires fewer trips to transfer the same number of boats than are required by tools which transfer one boat.

Thus, the improved transfer tool of the present invention may quickly and efficiently carry quartz wafer boats between transfer machines, in-process storage and opened or closed boat loaders without human presence in the vicinity of the tool. Further, the improved wafer boats are designed to be carried by two different modes and may be transferred by the tool both open and closed boat loaders, with the transfer from a wafer transfer machine (from plastic carriers to quartz boats) to closed boat loaders being effected in two steps and each step requires the boats to be carried by a different mode.

While certain preferred embodiments of the invention have been shown and described, it is to be distinctly understood that the invention is not limited thereto but may be otherwise embodied within the scope of the following claims.

What is claimed is:

1. A wafer boat transfer tool for use with an automated drive, said tool comprising:
   an upper fork means disposed in a generally horizontal plane;
   a lower fork means underlying said upper fork means in spaced parallel relation thereto,
   each of said fork means having a pair of tines adapted to support a boat, each pair of tines having a centerline extending in a direction fore-and-aft of the tool,
   a normally upright post rigidly interconnecting said upper and lower fork means,
   said post being laterally offset from said centerlines,
   drive coupling means on said post intermediate said upper and lower fork means for connecting said tool to said drive.

2. The wafer boat transfer tool of claim 1 wherein the tines of one of said pairs are spaced at a distance from each other which is different from the distance between the tines of the other pair.

3. The wafer boat transfer tool of claim 1 wherein at least one pair of tines is adapted to engage the bottom of a boat.

4. The wafer boat transfer tool of claim 1 wherein at least one pair of tines is adapted to engage the side of a boat.

5. The wafer boat transfer tool of claim 1 wherein one pair of tines is adapted to engage the bottom of a boat and the other pair is adapted to engage the side of a boat.

6. The wafer boat transfer tool of claim 5 wherein at least one pair of tines is adapted to engage the sides of the boat at three spaced apart locations that are not vertically coplanar.

7. The wafer boat transfer tool of claim 1 wherein each pair of tines is adapted to engage the sides of the boats.

8. The wafer boat transfer tool of claim 1 wherein each pair of tines is adapted to engage the bottoms of the boats.

9. A wafer boat comprising an upwardly concaved shell having longitudinally disposed rails within the shell along each one of its upper edges, the shell having two spaced apart slots below one of said rails and one slot below the other rail longitudinally disposed between the slots of said one rail.

10. The wafer boat of claim 9 further comprising a second set of longitudinally disposed rails along its outer surface and between the rails along the upper edges.

* * * * *